US008222702B2

(12) United States Patent
Onsongo et al.

(10) Patent No.: US 8,222,702 B2
(45) Date of Patent: Jul. 17, 2012

(54) CMOS DIODES WITH DUAL GATE CONDUCTORS, AND METHODS FOR FORMING THE SAME

(75) Inventors: David M. Onsongo, Newburgh, NY (US); Werner Rausch, Stormville, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/814,930

(22) Filed: Jun. 14, 2010

(65) Prior Publication Data

US 2010/0252881 A1     Oct. 7, 2010

Related U.S. Application Data

(63) Continuation of application No. 11/380,278, filed on Apr. 26, 2006, now Pat. No. 7,737,500.

(51) Int. Cl.
*H01L 21/70* (2006.01)
(52) U.S. Cl. .. 257/369; 257/357; 257/355; 257/E27.063
(58) Field of Classification Search ................. 257/357, 257/369, 355, E27.063
See application file for complete search history.

(56) References Cited

U.S. PATENT DOCUMENTS

| 5,382,818 A | 1/1995 | Pein |
| 5,468,669 A | 11/1995 | Lee et al. |
| 5,683,941 A * | 11/1997 | Kao et al. ................ 438/592 |
| 5,759,886 A | 6/1998 | Chung |
| 6,015,993 A | 1/2000 | Voldman et al. |
| 6,232,163 B1 | 5/2001 | Voldman et al. |
| 6,255,198 B1 | 7/2001 | Linthicum et al. |
| 6,309,950 B1 | 10/2001 | Forbes |
| 6,423,613 B1 | 7/2002 | Geusic |
| 6,429,482 B1 | 8/2002 | Culp et al. |
| 6,538,330 B1 | 3/2003 | Forbes |
| 6,559,470 B2 | 5/2003 | Tsu-Jae et al. |
| 6,602,764 B2 | 8/2003 | Linthicum et al. |
| 6,630,713 B2 | 10/2003 | Geusic |
| 6,724,024 B1 | 4/2004 | Tsu-Jae |
| 6,768,156 B1 | 7/2004 | Bhattacharyya |

(Continued)

OTHER PUBLICATIONS

PCT/US2007/67361—Filed Apr. 25, 2007—PCT ISR/WO.

(Continued)

*Primary Examiner* — Bradley K Smith
*Assistant Examiner* — Amar Movva
(74) *Attorney, Agent, or Firm* — Scully, Scott, Murphy & Presser, P.C.; Joseph P. Abate, Esq.

(57) ABSTRACT

The present invention provides an improved CMOS diode structure with dual gate conductors. Specifically, a substrate comprising a first n-doped region and a second p-doped region is formed. A third region of either n-type or p-type conductivity is located between the first and second regions. A first gate conductor of n-type conductivity and a second gate conductor of p-type conductivity are located over the substrate and adjacent to the first and second regions, respectively. Further, the second gate conductor is spaced apart and isolated from the first gate conductor by a dielectric isolation structure. An accumulation region with an underlying depletion region can be formed in such a diode structure between the third region and the second or the first region, and such an accumulation region preferably has a width that is positively correlated with that of the second or the first gate conductor.

16 Claims, 15 Drawing Sheets

U.S. PATENT DOCUMENTS

| | | |
|---|---|---|
| 6,852,167 B2 | 2/2005 | Ahn |
| 6,861,680 B2 | 3/2005 | Ker et al. |
| 6,864,104 B2 | 3/2005 | King |
| 6,894,327 B1 | 5/2005 | Tsu-Jae |
| 6,912,151 B2 | 6/2005 | King |
| 6,933,548 B1 | 8/2005 | King |
| 6,956,262 B1 | 10/2005 | Tsu-Jae |
| 2002/0109153 A1 | 8/2002 | Ker et al. |
| 2004/0180484 A1* | 9/2004 | Furukawa et al. ............ 438/197 |
| 2005/0089257 A1 | 4/2005 | Barrios et al. |
| 2005/0167786 A1 | 8/2005 | Gill et al. |

OTHER PUBLICATIONS

Raissi, F., "A Brief Analysis of the Field Effect Diode and Breakdown Transistor", IEEE Transactions on Electron Devices, Feb. 1996, vol. 43, No. 2.

* cited by examiner

CMOS DIODES WITH DUAL GATE CONDUCTORS, AND METHODS FOR FORMING THE SAME

CROSS REFERENCE TO RELATED APPLICATION

This application is a continuation of U.S. patent application Ser. No. 11/380,278, filed Apr. 26, 2006 the entire content and disclosure of which is incorporated herein by reference.

FIELD OF THE INVENTION

The present invention relates to improved complementary metal-oxide-semiconductor (CMOS) diode structures. More specifically, the present invention relates to CMOS diodes having dual gate conductors, which function to reduce the P+/N+variation and the ideality variation of the CMOS diodes.

BACKGROUND OF THE INVENTION

A diode is a critical device in CMOS technology, which can be used in bandgap reference circuits. FIG. 1 shows a conventional CMOS diode formed in a semiconductor substrate 110. The semiconductor substrate 110 comprises a first region 112 that has n-type conductivity and a second region 114 that has p-type conductivity. The first and second regions 112 and 114 jointly define a third region 113 located therebetween in the semiconductor substrate 110, which has either n-type or p-type conductivity, but at a significantly lower dopant concentration in comparison with the first or second regions 112 or 114. The first and second regions 112 and 114 may also comprise surface silicide layers 112A and 114A, as shown in FIG. 1.

The CMOS diode is typically defined by a single gate conductor, which is located over a gate dielectric layer 120 on top of the semiconductor substrate 110 and which includes a first portion 122 of n-type conductivity and a second portion 124 of p-type conductivity, as shown in FIG. 1. The first portion 122 of the gate conductor is located adjacent to the first region 112, and the second portion 124 is located adjacent to the second region 114. The first and second portions 122 and 124 of the gate conductor are in direct contact with each other and are shorted by a common surface silicide layer 123.

One or more optional sidewall spacers 126 may optionally be provided along sidewalls of the gate conductor to isolate the gate conductor from the first and second doped regions 112 and 114. Further, one or more dielectric cap layer 130 can be provided over the entire structure, including the gate conductor as well as the semiconductor substrate 110.

Between the p-doped second region 114 and the n-doped first region 112, a carrier accumulation region 116 is formed in the lightly n-doped third region 113 of the semiconductor substrate 110 and immediately underneath the p-doped second portion 124 of the gate conductor, due to the work function difference between the n-doped and p-doped regions. Further, a depletion region 118 is formed under the carrier accumulation region 116 at the diode interface between the lightly n-doped third region 113 and the p-doped second region 114, as shown in FIG. 1.

The widths of the accumulation region 116 and the depletion region 118 are positively correlated with that of the p-doped second portion 124 of the gate conductor. However, doping of the first and second portions 122 and 124 of the single gate conductor is typically achieved by masked dopant implantation, which, due to limitations of the lithographic tools used, can result in significant overlay mis-alignment and critical dimension (CD) variations. Therefore, the width of the resulting p-doped second portion 124 of the gate conductor may vary significantly. Consequently, the widths of the accumulation region 116 and the depletion region 118 may vary significantly, which in turn leads to deleterious electric field variation at the diode interface.

Performance of the CMOS diode can be measured by a parameter commonly referred to as the diode ideality factor. The diode ideality factor n indicates how closely the I-V (i.e., current-voltage) characteristic of the diode matches the ideal characteristic. For ideal diodes, n=1.0. It is typically desired to have diode ideality variation of less than 0.28% in integrated circuit designs.

However, the width of the accumulation region 116 and its interaction with the underlying depletion region 118 directly impact the diode ideality, because the diode ideality is adversely affected by electron/hole recombination occurred in the depletion region 118, and because the accumulation region 116 provides an source of electrons in addition to the lightly n-doped third region 113, which increases the likelihood of electron/hole recombination in the depletion region 118. Consequently, the width variations generated by the masked dopant implantation lead to significantly large ideality variations ($\approx$4%) in the CMOS diodes currently available for the 90 nm node circuits, which is far beyond the desired variation limit.

There is therefore a need for an improved CMOS diode structure with reduced P/N gate variation, which function to reduce the width variation of the accumulation region and its interaction with the underlying depletion region and thereby reduce diode ideality variation.

There is further a need for a simple and cost-effective method for fabricating the improved CMOS diode structure that is compatible with conventional CMOS fabrication process, with few or no additional processing steps.

SUMMARY OF THE INVENTION

The present invention provides improved CMOS diodes with dual gate conductors, one of which is doped with n-type dopant species and the other is doped with p-type dopant species. The widths of the P+/N+ doped regions in such dual gate conductors are determined by a gate patterning process, instead of the error-prone masked dopant implantation process, and therefore have significantly reduced variations. Consequently, the ideality factor variations in such improved CMOS diodes are advantageously reduced.

In one aspect, the present invention provides a semiconductor device comprising:

a semiconductor substrate comprising a first doped region of n-type conductivity and a second doped region of p-type conductivity with a third doped region located therebetween, wherein the third doped region has either n-type or p-type conductivity with a dopant concentration lower than that of the first or second region;

a gate dielectric layer located over the semiconductor substrate;

a first gate conductor of n-type conductivity, which is located on the dielectric layer adjacent to the first doped region in the semiconductor substrate; and a second gate conductor of p-type conductivity, which is located on the dielectric layer adjacent to the second doped region in the semiconductor substrate and which is spaced apart and isolated from the first gate conductor by a dielectric isolation structure therebetween, wherein the first, second, and third doped regions and the first and second gate conductors are arranged and constructed to form an accumulation region and an underlying depletion region between the third doped region and the second or the first doped region.

Preferably, the dielectric isolation structure comprises a dielectric material selected from the group consisting of oxides, nitrides, and oxynitrides. In a specific embodiment of the present invention, the dielectric isolation structure comprises silicon nitride. In an alternative embodiment of the present invention, the dielectric isolation structure comprises silicon oxide.

The first and second doped regions and the first and second gate conductors may each comprise a surface silicide layer. Further, one or more dielectric spacers may be provided along sidewalls of the first and second gate conductors. In a preferred, but not necessary, embodiment of the present invention, the dielectric spacers comprise one or more oxide spacers and/or nitride spacers. Moreover, a dielectric cap layer can be provided over the first and second gate conductors and the semiconductor substrate for capping the semiconductor device.

In another aspect, the present invention relates to a semiconductor device comprising:

a semiconductor substrate comprising a first doped region of n-type conductivity and a second doped region of p-type conductivity with a third doped region located therebetween, wherein the third doped region has n-type conductivity with a dopant concentration lower than that of the first region;

a gate dielectric layer located over the semiconductor substrate;

a first gate conductor of n-type conductivity, which is located on the dielectric layer adjacent to the first doped region in the semiconductor substrate; and a second gate conductor of p-type conductivity, which is located on the dielectric layer adjacent to the second doped region in the semiconductor substrate and which is spaced apart and isolated from the first gate conductor by a dielectric isolation structure therebetween, wherein the first, second, and third doped regions and the first and second gate conductors are arranged and constructed to form an accumulation region and an underlying depletion region between the third doped region and the second doped region.

In a further aspect, the present invention relates to a semiconductor device comprising:

a semiconductor substrate comprising a first doped region of n-type conductivity and a second doped region of p-type conductivity with a third doped region located therebetween, wherein the third doped region has p-type conductivity with a dopant concentration lower than that of the second region;

a gate dielectric layer located over the semiconductor substrate;

a first gate conductor of n-type conductivity, which is located on the dielectric layer adjacent to the first doped region in the semiconductor substrate; and a second gate conductor of p-type conductivity, which is located on the dielectric layer adjacent to the second doped region in the semiconductor substrate and which is spaced apart and isolated from the first gate conductor by a dielectric isolation structure therebetween, wherein the first, second, and third doped regions and the first and second gate conductors are arranged and constructed to form an accumulation region and an underlying between the third doped region and the first doped region.

In a still further aspect, the present invention relates to a method for forming a semiconductor device, comprising:

forming a gate dielectric layer over a semiconductor substrate that has a well region of either n-type or p-type conductivity located therein;

forming first and second gate conductors over the gate dielectric layer, wherein the first and second gate conductors are spaced apart from each other;

forming a dielectric isolation structure between the first and second gate conductors;

selectively doping the first gate conductor and a first region in the well-region of the semiconductor substrate with an n-type dopant species; and selectively doping the second gate conductor and a second region in the well-region of the semiconductor substrate with a p-type dopant species, said second region being spaced apart from the first region and thereby defining a third region therebetween in the well region, wherein the first, second and third doped regions and the first and second gate conductors are arranged and constructed to form an accumulation region and an underlying depletion region between the third region and the second or first region.

In a preferred, but not necessary, embodiment of the present invention, the well region of the semiconductor substrate has n-type conductivity. The accumulation region and the underlying depletion region are correspondingly formed between the third region and the second region, and the accumulation region has a width that is positively correlated with that of the second gate conductor.

In an alternative embodiment of the present invention, the well region of the semiconductor substrate has p-type conductivity. The accumulation region and the underlying depletion region are then formed between the third region and the first region, and the accumulation region has a width that is positively correlated with that of the first gate conductor.

The dielectric isolation structure that isolates the first and second gate conductors can be formed by any suitable method. Preferably, but not necessarily, it is formed by depositing a blanket dielectric layer over both the first and second gate conductors, followed by patterning at least a portion of the blanket dielectric layer to form the dielectric isolation structure located between the first and second gate conductors. More preferably, additional portions of the blanket dielectric layers are patterned into one or more dielectric spacers along sidewalls of the first and second gate conductors.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention provides improved CMOS diodes with dual gate conductors. Specifically, the CMOS diodes of the present invention each contains a first gate conductor of n-type conductivity and a second gate conductor of p-type conductivity, while the first and second gate conductors are isolated from each other by a dielectric isolation structure located therebetween.

Figure 2:
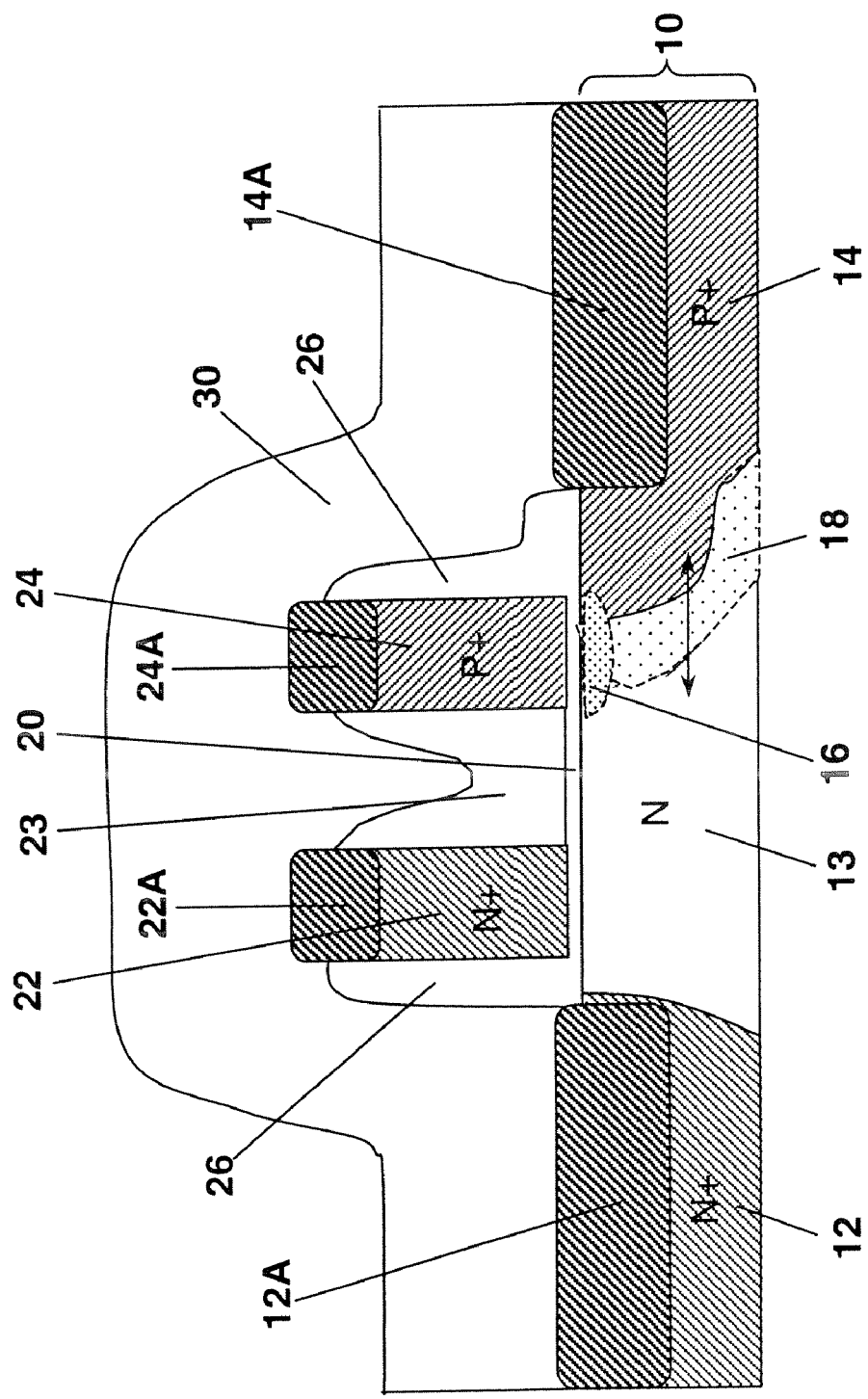
FIG. 2 shows an improved CMOS diode structure with dual gate conductors, the first of which is n-doped and the second of which is p-doped, while such first and second gate conductors are isolated from each other by a silicon nitride isolation region located therebetween, according to one embodiment of the present invention.

FIG. 2 shows a cross-sectional view of an exemplary CMOS diode, according to one embodiment of the present invention.

The exemplary CMOS diode is formed in a semiconductor substrate 10, which may comprise any suitable semiconductor material, which includes, but is not limited to: Si, SiC, SiGe, SiGeC, Ge alloys, GaAs, InAs, InP, as well as other III-V or II-VI compound semiconductors, either in their single crystalline or polycrystalline form. The semiconductor substrate 10 may also comprise an organic semiconductor or a layered semiconductor such as Si/SiGe, a silicon-on-insulator (SOI) or a SiGe-on-insulator (SGOI). Preferably, the semiconductor substrate 10 is composed of a Si-containing semiconductor material, i.e., a semiconductor material that includes silicon. More preferably, the semiconductor substrate 10 consists essentially of bulk single crystal silicon. Alternatively, the semiconductor substrate 10 may comprise one or more buried insulator layers (not shown) therein and thereby form a semiconductor-on-insulator (SOI) configuration.

The semiconductor substrate 10 is preferably doped with either an n-type or a p-type dopant species at a relatively low dopant concentration (e.g., from about $1\times10^{14}/cm^2$ to about $1\times10^{15}/cm^2$). Alternatively, the semiconductor substrate 10 may comprise a well region (not shown) that is doped with either an n-type or a p-type dopant species at a relatively low dopant concentration.

A first doped region 12 having a relatively high concentration (e.g., from about $1\times10^{15}/cm^2$ to about $1\times10^{16}/cm^2$) of n-type dopant species (i.e., the n⁺-doped region) and a second doped region 14 having a relatively high concentration of p-type dopant species (i.e., the p⁺-doped region) are further provided in the semiconductor substrate 10 in a spaced-apart relationship from each other. In this manner, a third doped region 13 with n-type (as shown in FIG. 2) or p-type (not shown) dopant species at a relatively low dopant concentration (i.e., the n- or p-doped region) is defined by the spaced-apart first and second doped regions 12 and 14.

A gate structure with dual gate conductors of opposite conductivity types is then formed over the semiconductor substrate 10. Specifically, the gate structure of the present invention comprises: (1) a gate dielectric layer 20, which is formed directly over the semiconductor substrate 10, (2) a first gate conductor 22, which is doped with a n-type dopant species at a relatively high dopant concentration and which is located over the gate dielectric layer 20 adjacent to the first doped region 12, and (3) a second gate conductor 24, which is doped with a p-type dopant species at a relatively high dopant concentration and which is also located over the gate dielectric layer 20 but adjacent to the second doped region 14. The first and second gate conductors 22 and 24 are spaced apart from each other by a dielectric isolation structure 23 that is located therebetween. Further, the gate structure of the present invention may comprise one or more optional dielectric spacers 26 along sidewalls of the first and second gate conductors 22 and 24.

In the specific embodiment as illustrated by FIG. 2, the third doped region 13 contains n-type dopant species. Correspondingly, an N/P diode interface is formed between the third doped region 13 (i.e., the n-doped region) and the second doped region 14 (i.e., the p⁺-doped region). A carrier accumulation region 16 is generated immediately underneath the second gate conductor 24, due to the work function difference between the n-doped and p-doped regions. There also exists a carrier depletion region 18 underneath the carried accumulation region 16 along the N/P diode interface, which is located between the third doped region 13 (i.e., the n-doped region) and the second doped region 14 (i.e., the p⁺-doped region).

The width of the accumulation region 16 is determined by, and positively correlated with, the width of the second gate conductor 24. Because the second gate conductor 24 is structurally isolated from the first gate conductor 22 by the dielectric isolation structure 23, the width of the second gate conductor 24 is determined solely by the gate patterning process (as described in more detail hereinafter) and is no longer affected by any potential overlay misalignment occurred during the masked dopant implantation process. Therefore, width variation of the second gate conductor 24 is significantly reduced, which leads to reduction in the width variation of the carrier accumulation region 16 and its interaction with the underlying depletion region 18 and thereby reduces diode ideality variation.

Alternatively, the third doped region 13 may contain p-type dopant species (not shown). Correspondingly, an N/P diode interface is formed between the first doped region 12 (i.e., the n⁺-doped region) and the third doped region 13 (i.e., the p-doped region). A carrier accumulation region (not shown) is generated immediately underneath the first gate conductor 22, due to the work function difference between the n-doped and p-doped regions. There also exists a carrier depletion region (not shown) underneath the carried accumulation region along the N/P diode interface, which is located between the first doped region 12 (i.e., the n⁺-doped region) and the third doped region 13 (i.e., the p-doped region). The width of the carrier accumulation region (not shown) is then determined by, and positively correlated with, the width of the first gate conductor 22. As mentioned hereinabove, because the first gate conductor 22 is structurally isolated from the second gate conductor 24 by the dielectric isolation structure 23, the width of the first gate conductor 22 is determined solely by the gate patterning process (as described in more detail hereinafter) and is no longer affected by the potential overlay misalignment occurred during the masked dopant implantation process. Therefore, width variation of the first gate conductor 22 is significantly reduced, which leads to reduction in the width variation of the carrier accumulation region (not shown) and its interaction with the underlying depletion region (not shown) and thereby reduce diode ideality variation.

The CMOS diode structure as shown in FIG. 2 further comprises optional silicide layers 12A, 14A, 22A and 24A respectively located over the surfaces of the first doped region 12, the second doped region 14, the first gate conductor 22 and the second gate conductor 24. A dielectric cap layer 30 can also be provided over the entire CMOS diode structure to isolate such a CMOS diode from back-end-of-line (BEOL) interconnects.

Note that while FIG. 2 illustratively demonstrates an exemplary CMOS diode device structure according to a specific embodiment of the present invention, it is clear that a person ordinarily skilled in the art can readily modify the exemplary device structure for adaptation to specific application requirements, consistent with the above descriptions.

The exemplary CMOS diode structure of the present invention, as described hereinabove, can be readily formed by a fabrication process that is compatible with and can be readily integrated into the conventional CMOS process, with few or no additional processing steps. Specifically, exemplary processing steps for fabricating the CMOS diode structure of FIG. 2 are illustrated hereinafter by FIGS. 3-9.

Figure 3:
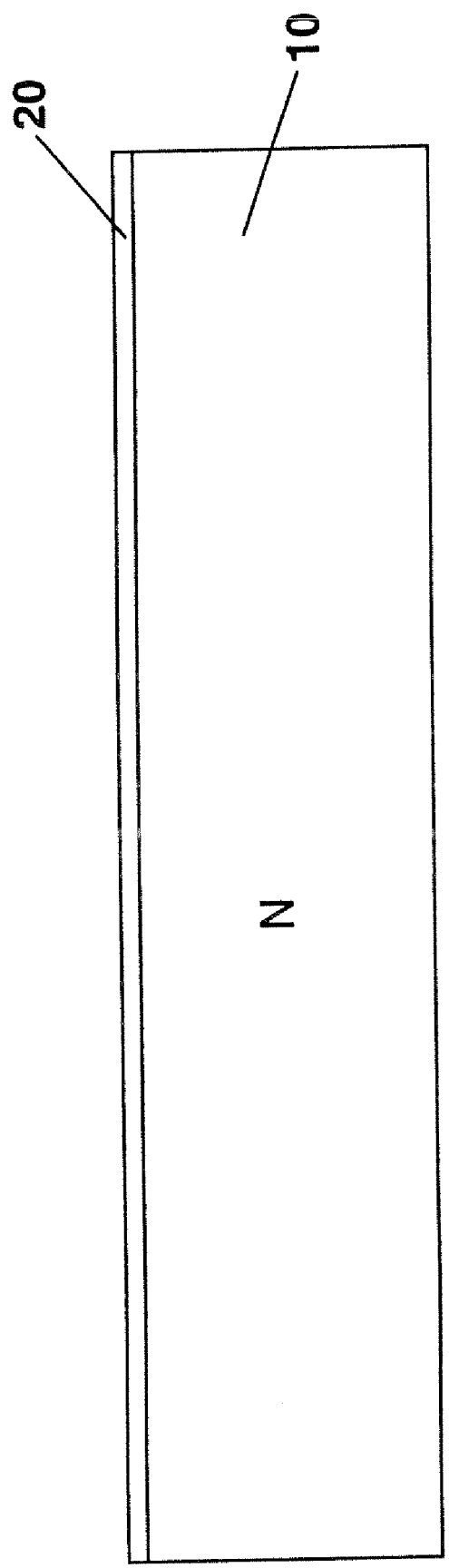
FIGS. 3-9 illustrate exemplary processing steps for fabricating the improved CMOS diode structure of FIG. 2, according to one embodiment of the present invention.
Figure 4:
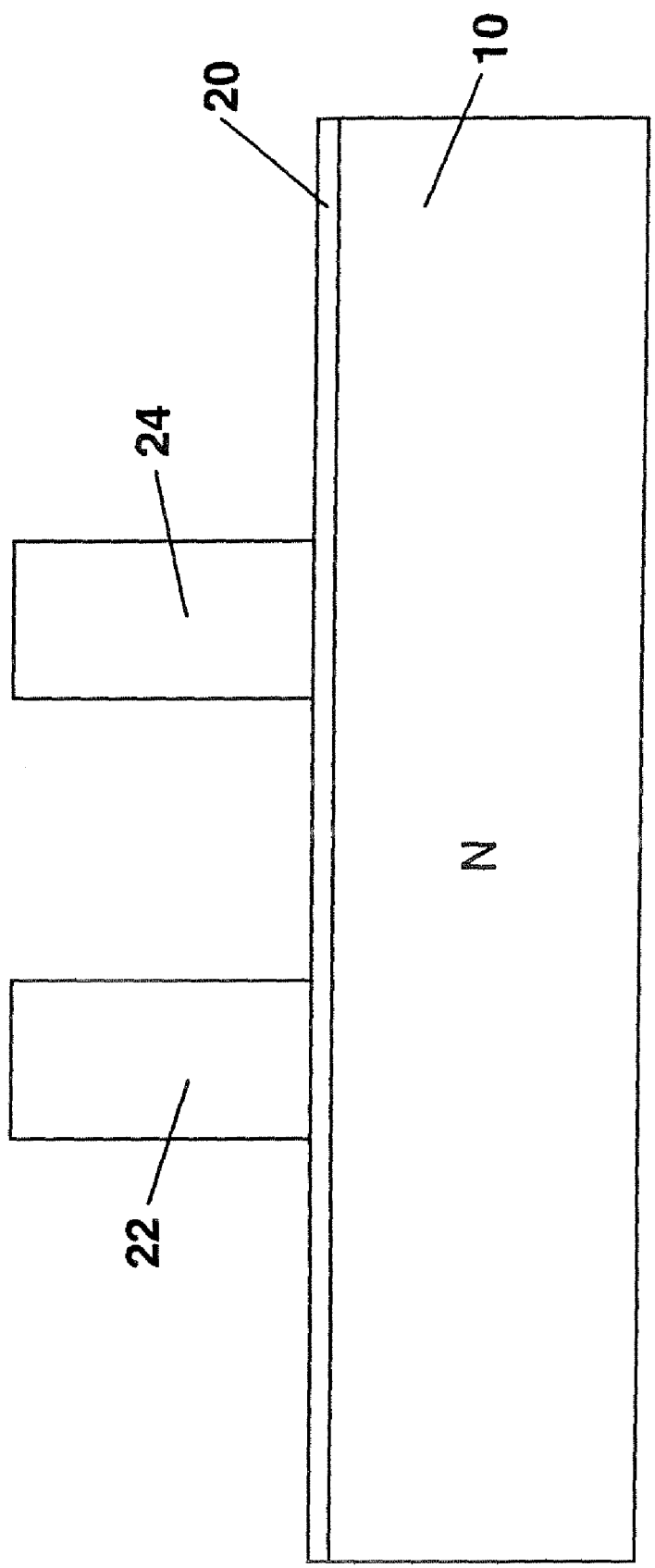

Reference is first made to FIG. 3, which shows formation of a gate dielectric layer 20 over the semiconductor substrate 10. The gate dielectric layer 20 may be comprised of any suitable dielectric material, including, but not limited to: oxides, nitrides, oxynitrides and/or silicates (including metal silicates and nitrided metal silicates). In one embodiment, it is preferred that the gate dielectric layer 20 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric layer 20 may vary, but typically, the gate dielectric layer 24 has a thickness from about 0.5 to about 10 nm, with a thickness from about 1 to about 5 nm being more typical. The gate dielectric layer 20 can be formed by a thermal growing process such as, for example, oxidation, nitridation or oxynitridation. Alternatively, the gate dielectric layer 20 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer 20 may also be formed utilizing any combination of the above processes.

Next, two or more spaced-apart gate conductors 22 and 24 are formed over the gate dielectric layer 20, by first depositing a blanket gate conductor layer (not shown) over the gate dielectric layer 20, followed by patterning the blanket gate conductor layer into the spaced-apart gate conductors 22 and 24 by conventional lithography and etching. The lithography step, preferably inverse gate level (PC) lithography, includes applying a photoresist (not shown) to the upper surface of the blanket gate conductor layer (not shown), exposing the photoresist to a desired pattern of radiation and developing the exposed photoresist utilizing a conventional resist developer. The pattern in the photoresist is then transferred to the gate conductor layer (not shown) utilizing one or more dry etching steps to form etch openings. Suitable dry etching processes that can be used in the present invention in patterning the blanket gate conductor layer (not shown) include, but are not limited to: reactive ion etching (RIE), ion beam etching, plasma etching or laser ablation. Preferably, the gate conductor layer comprises polycrystalline silicon (poly-Si), and etching is carried out by a poly-Si RIE step that stops on the gate dielectric layer 20. The patterned photoresist is then removed by resist stripping after etching has been completed.

Figure 5:
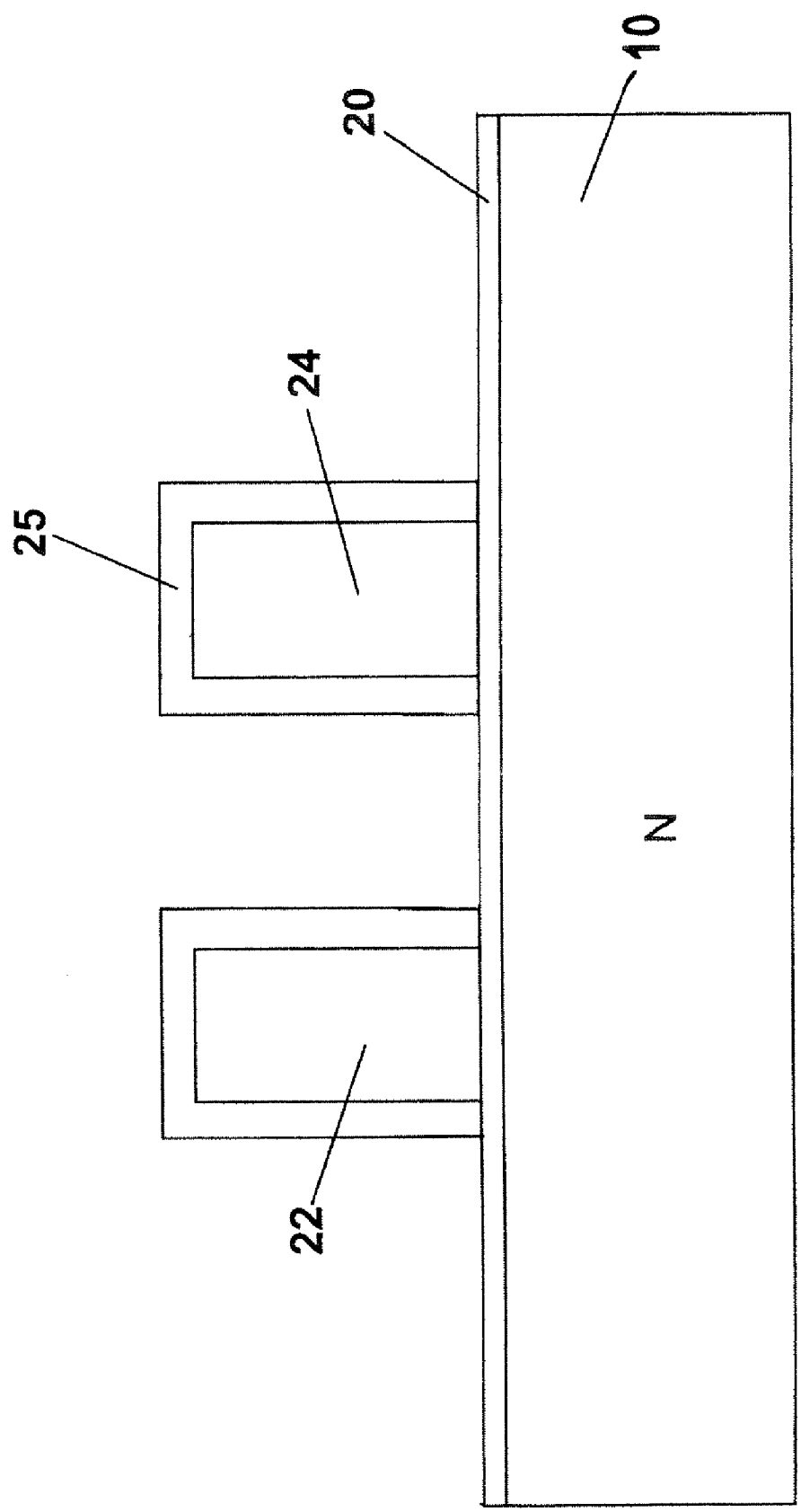

An optional oxide liner 25 can be formed over the first and second gate conductors 22 and 24 by a conventional re-oxidation process or low temperature oxidation (LTO) process, as shown in FIG. 5.

Figure 6:
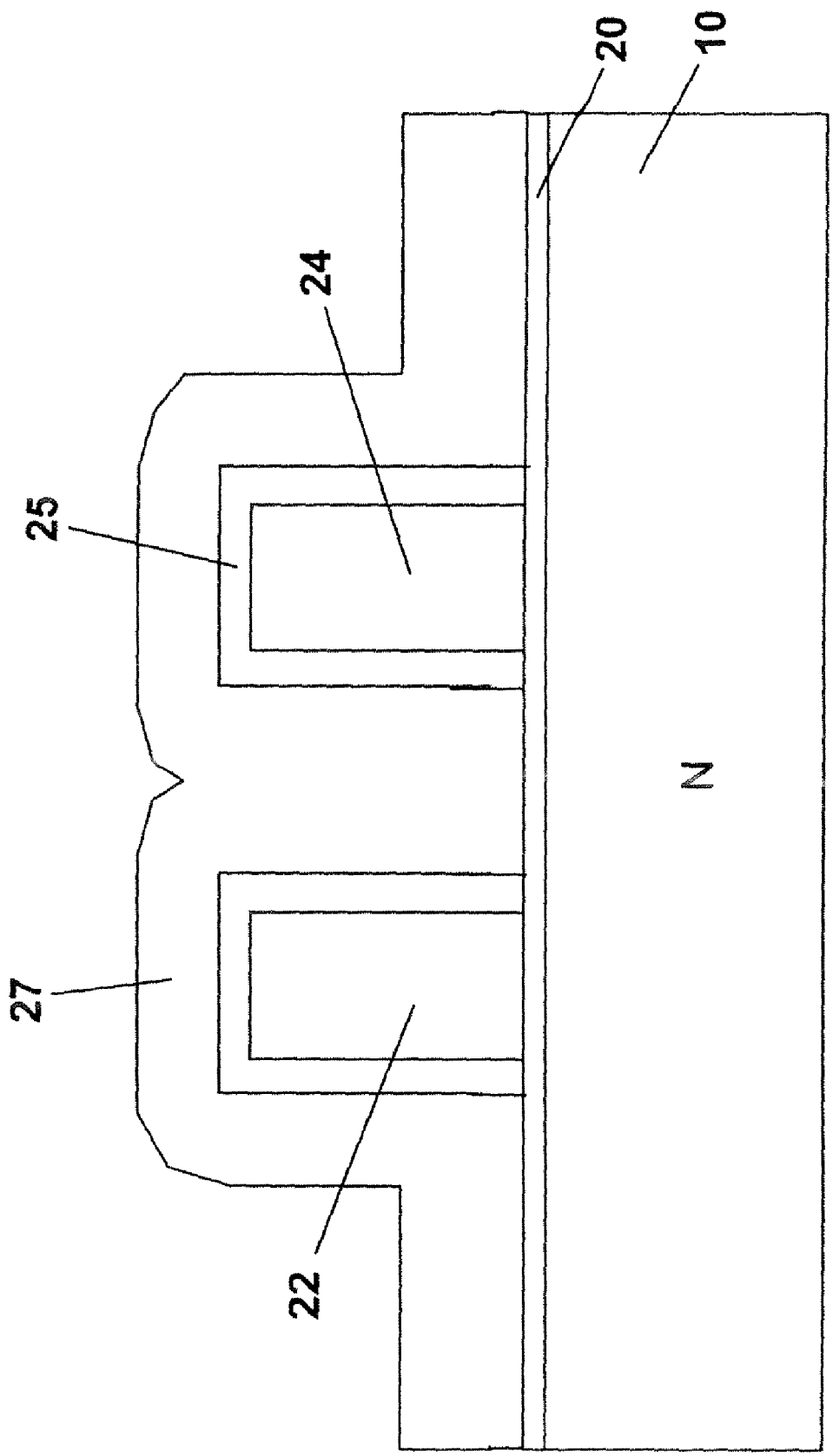

Subsequently, a blanket dielectric layer 27 is deposited over the entire structure to cover both the first and second gate conductor 22 and 24, as shown in FIG. 6. The blanket dielectric layer 27 may comprise any suitable dielectric material, including, but not limited to: oxides, nitrides, oxynitrides, or any combination thereof. In a specific embodiment of the present invention, the blanket dielectric layer 27 comprises silicon nitride. The blanket dielectric layer 27 can be deposited utilizing a deposition process such as, for example, physical vapor deposition or chemical vapor deposition. Preferably, but not necessarily, the blanket dielectric layer 27 has a thickness ranging from about 50 nm to about 150 nm, and more preferably from about 80 nm to about 120 nm.

Figure 7:
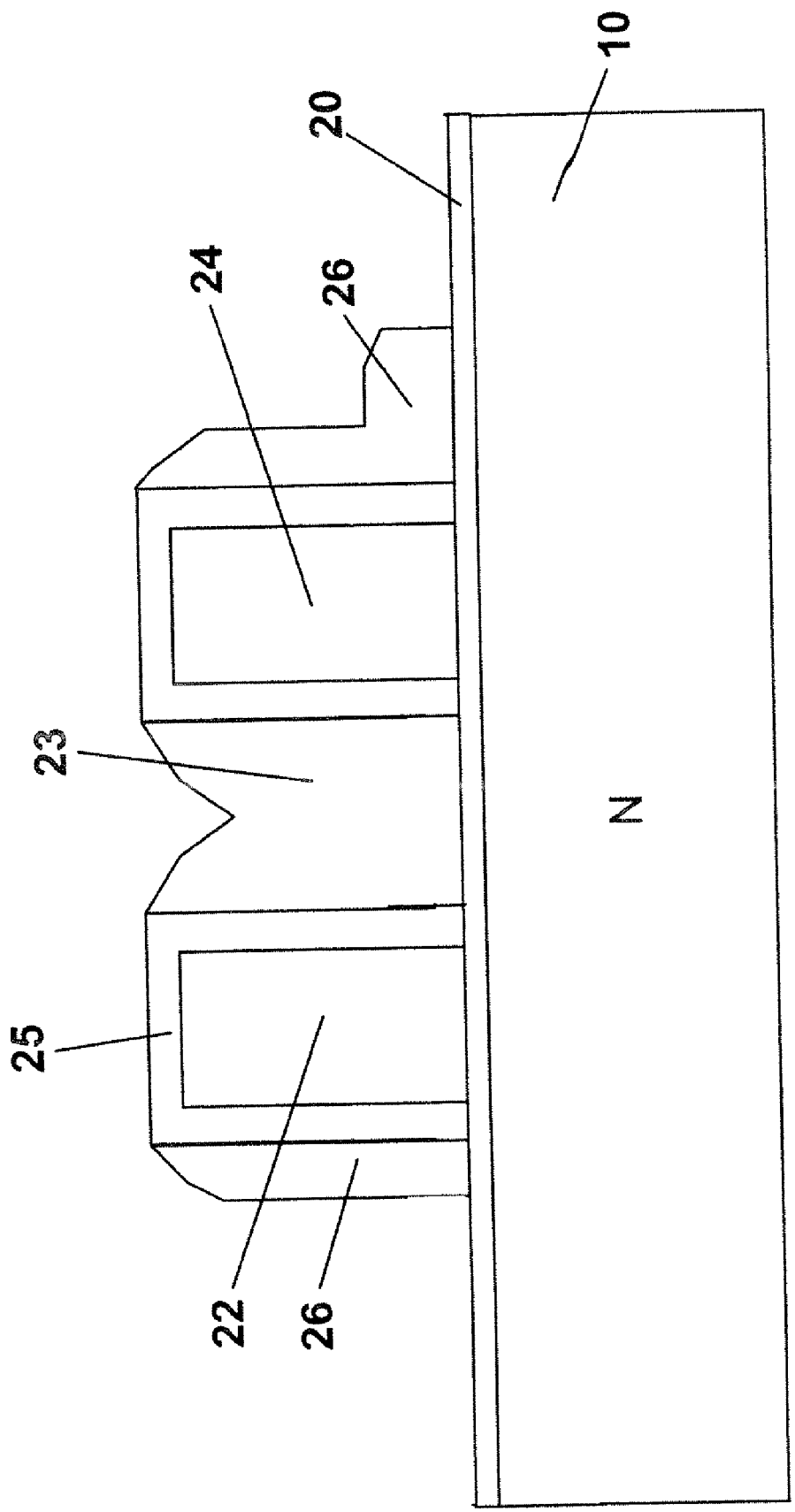

The blanket dielectric layer 27 is then patterned by conventional lithography and etching (similar to those described hereinabove) to form a dielectric isolation structure 23, which is preferably a silicon nitride isolation structure, located between the first and second gate conductors 22 and 24, as shown in FIG. 7. Preferably, but not necessarily, the blanket dielectric layer 27 is also patterned to form the optional silicon nitride spacers 26 along sidewalls of the first and second gate conductors 22 and 24.

Figure 8:
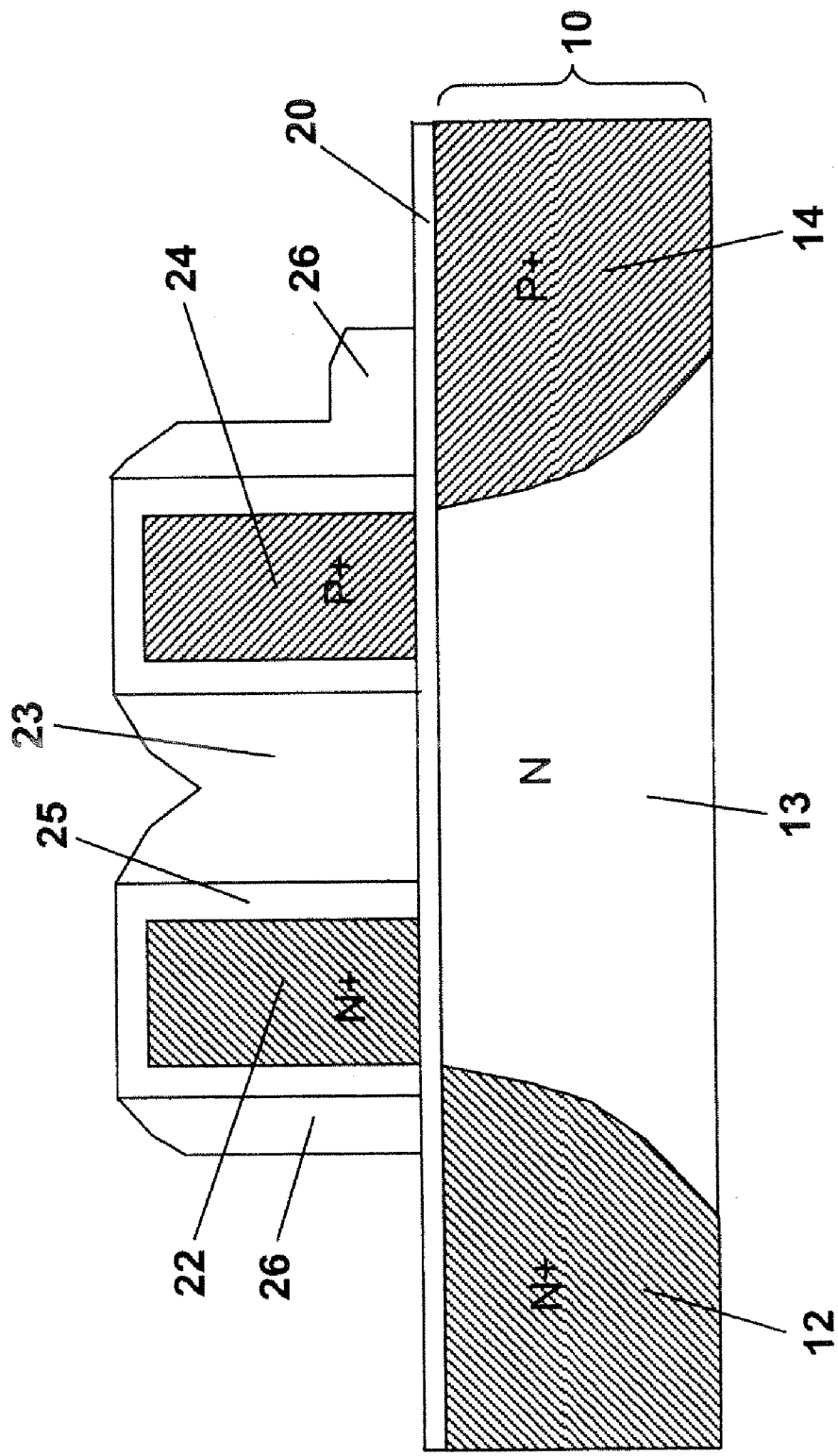

A first masked dopant implantation step is then carried out to selectively dope the first gate conductor 22 and an adjacent region 12 of the semiconductor substrate 10, thereby forming the $n^+$-doped first gate conductor 22 and the $n^+$-doped first region 12 in the semiconductor substrate 10, as shown in FIG. 8. Next, a second masked dopant implantation step is carried out to selectively dope the second gate conductor 24 and an adjacent region 14 of the semiconductor substrate 10, thereby forming the $p^+$-doped second gate conductor 24 and the $p^+$-doped second region 14 in the semiconductor substrate 10, as shown in FIG. 8. Note that the processing order of the first and second masked dopant implantation steps can be reversed, i.e., the first gate conductor 22 and the first region 12 can be doped after doping of the second gate conductor 24 and the second region 14. Such first and second masked dopant implantation steps are typically carried out by first forming a block mask over the regions that need to be protected from dopant implantation, followed by the dopant implantation to thereby selectively dope the regions that are not covered by the block mask. Because the masked dopant implantation techniques are known in the art, no additional detail is provided herein.

Figure 9:
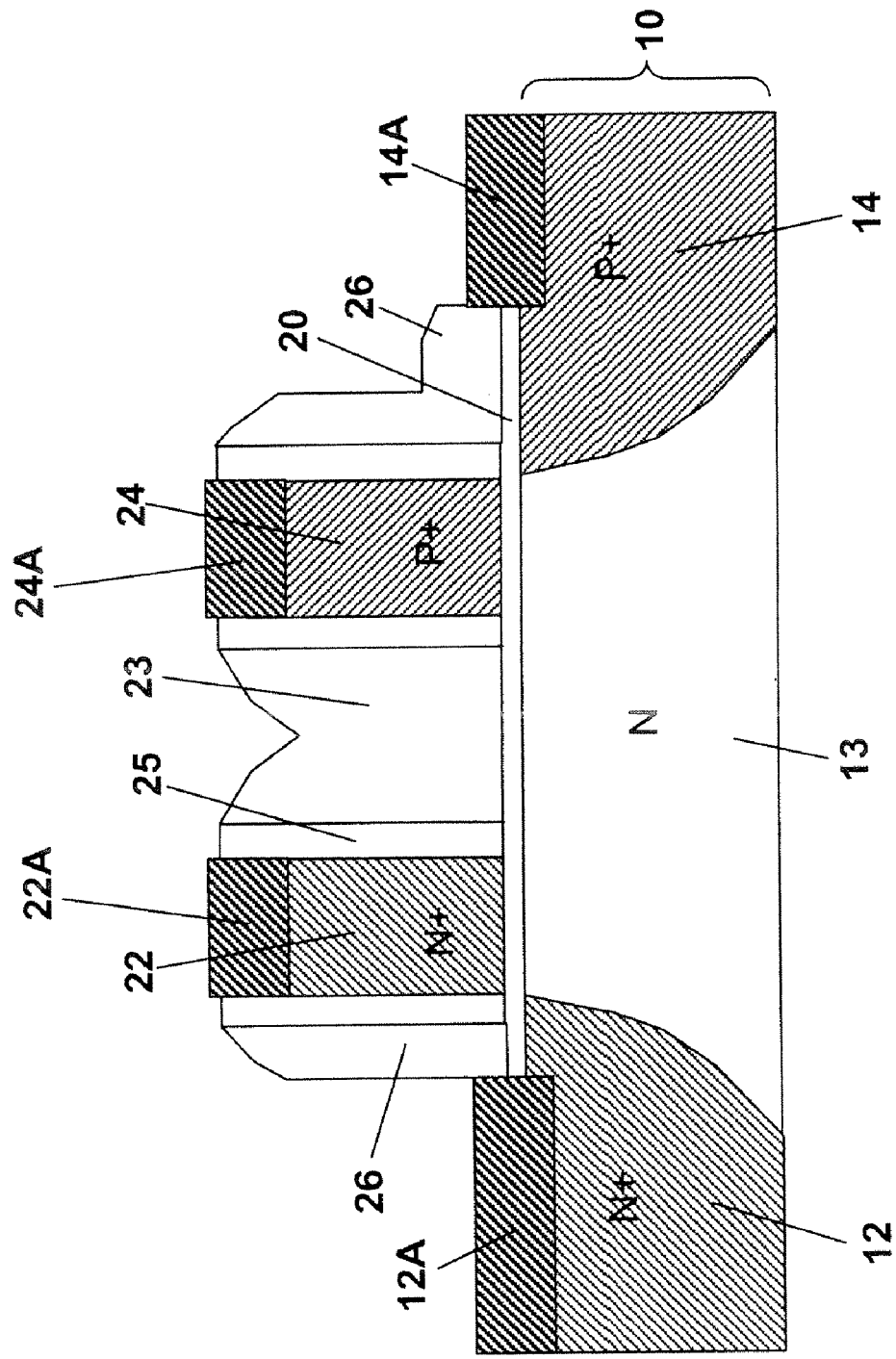

An optional silicidation step can be carried out after the first and second masked dopant implantation steps to form surface silicide layers 12A, 14A, 22A and 24A respectively over the first and second doped regions 12 and 14 and the first and second gate conductors 22 and 24, as shown in FIG. 9. Further, a blanket dielectric cap layer (not shown) can be deposited over the entire structure after the optional silicidation step to thereby form the CMOS diode structure as shown in FIG. 2.

Due to the structural isolation of the first and second gate conductors 22 and 24, any overlay mis-alignment occurred during the first and second masked dopant implantation steps has little or no impact on the actual widths of the resulting $P^+/N^+$-doped regions in the first and second gate conductors 22 and 24. The dielectric isolation structure 23 located between the first and second gate conductors 22 and 24 provides a buffer structure that absorbs excess dopant and significantly reduces the potential deleterious impact of such excess dopant on the electrical field at or near the diode interface.

Figure 1:
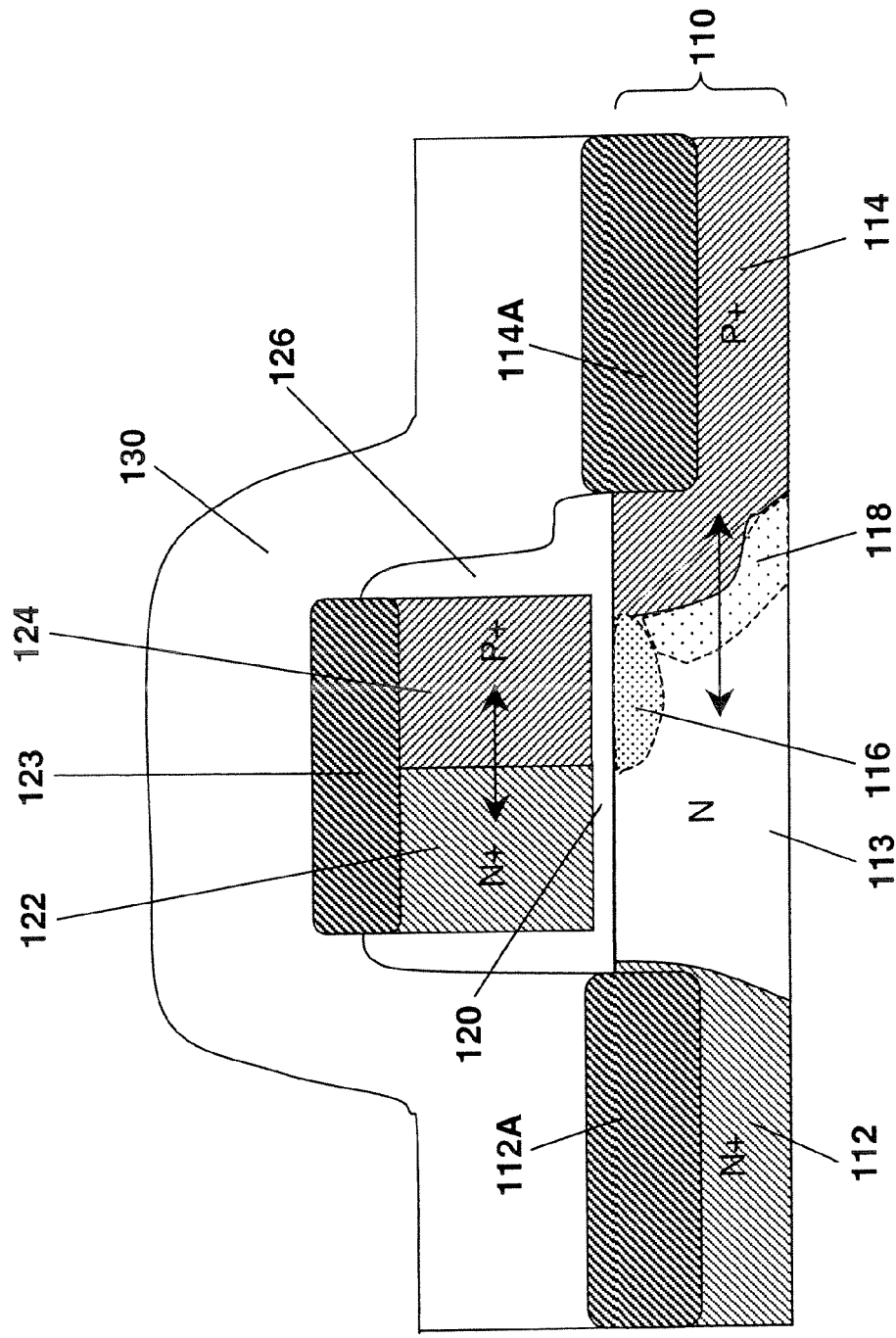
FIG. 1 shows a conventional CMOS diode structure with a single gate conductor having connected first and second portions that are respectively doped with n-type and p-type dopant species.

Consequently, the resulting CMOS diode with such isolated first and second gate conductors 22 and 24 are resistant to overlay alignment errors typically associated with the masked dopant implantation steps, and the critical dimension and ideality variations of such a CMOS diode is significantly reduced in comparison with the conventional CMOS diode shown by FIG. 1.

Although the exemplary CMOS diode as shown by FIG. 2 preferably comprises a silicon nitride isolation structure between the first and second gate conductors 22 and 24, it is readily understood that other dielectric materials, such as oxides or oxynitrides, can also be used to form the dielectric isolation structure between the first and second gate conductors 22 and 24. FIGS. 10-14 specifically shows exemplary processing steps for forming an alternative CMOS diode with spaced apart first and second gate conductors 22 and 24 that are isolated from each other by a silicon oxide isolation structure 23'.

Figure 10:
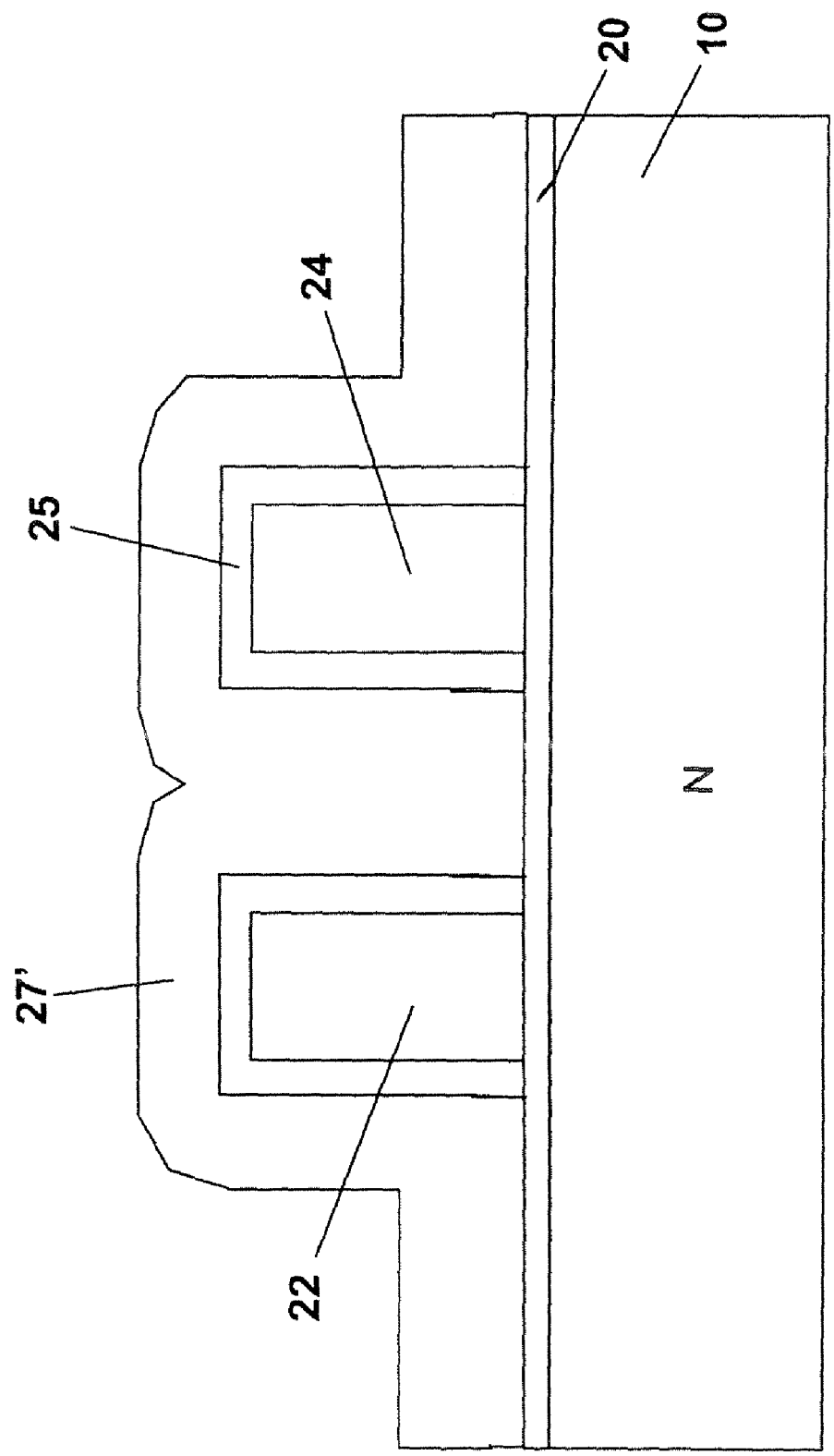
FIGS. 10-14 illustrate exemplary processing steps for fabricating an improved CMOS diode structure with dual gate conductors, the first of which is n-doped and the second of which is p-doped, while such first and second gate conductors are isolated from each other by a silicon oxide isolation region located therebetween, according to one embodiment of the present invention.
Figure 11:
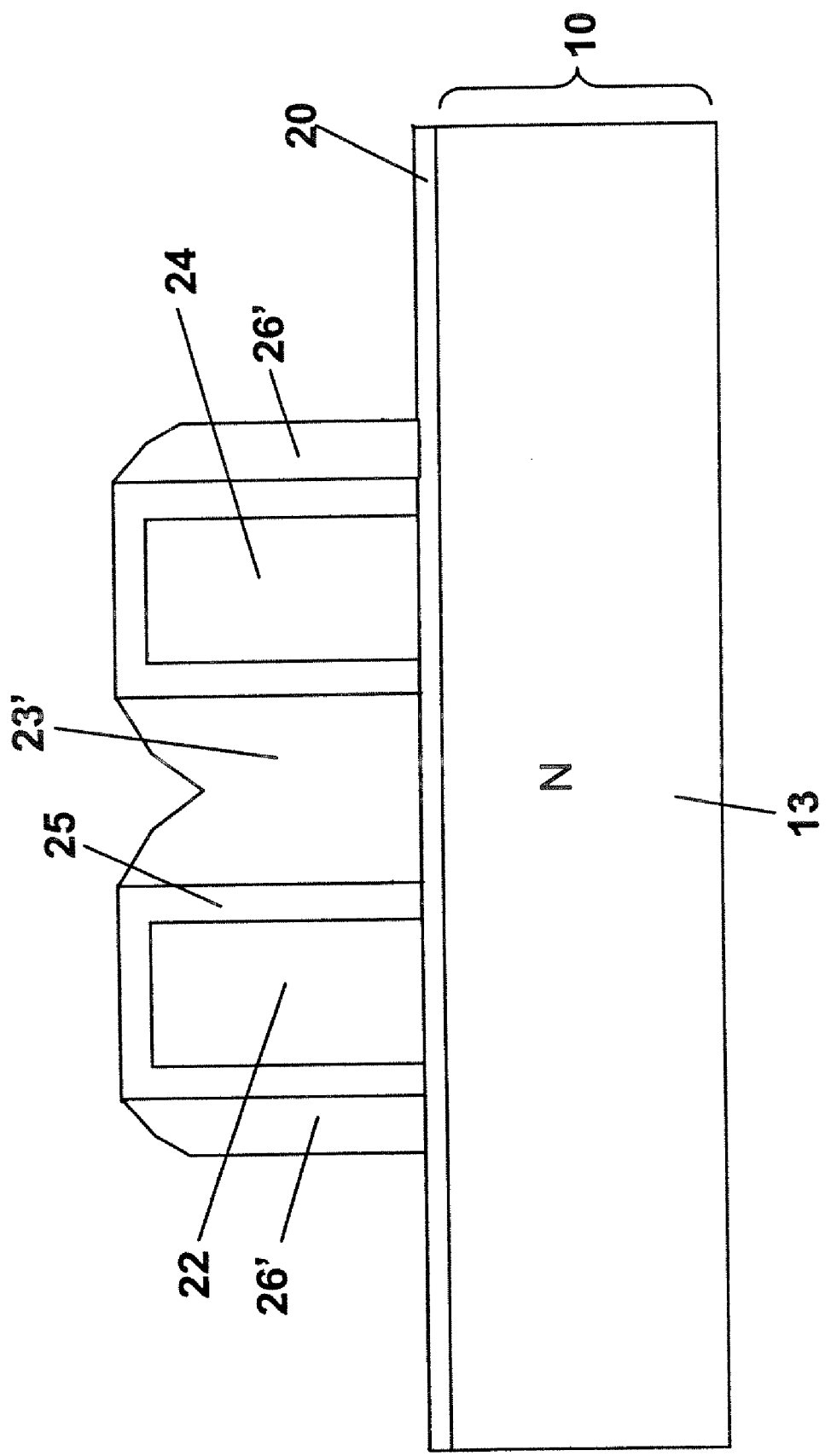
Figure 12:
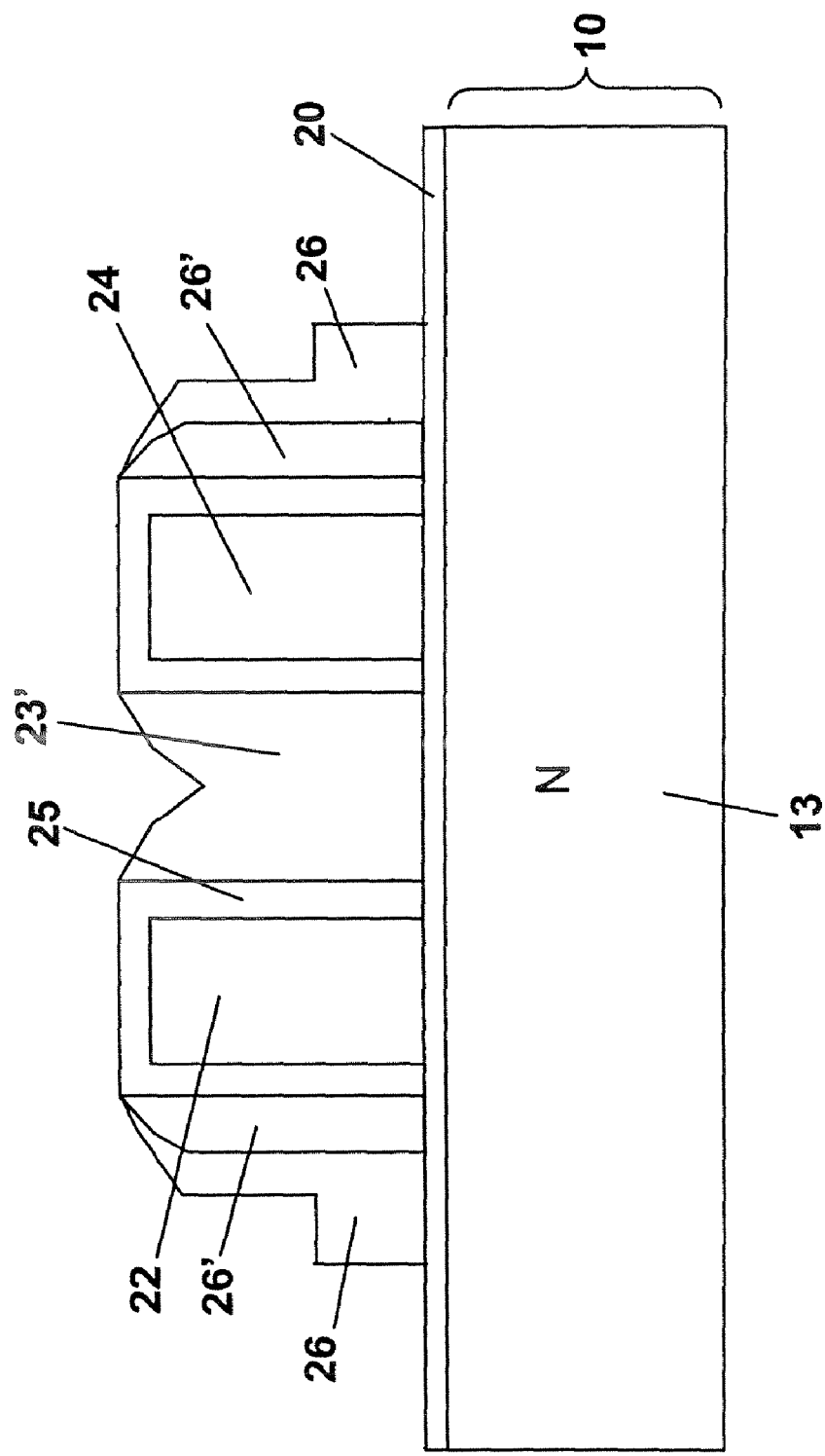

First, FIG. 10 shows deposition of a blanket silicon oxide layer 27', instead of the blanket silicon nitride layer 27 as shown in FIG. 6, over the entire structure including the first and second gate conductors 22 and 24.

The blanket silicon oxide layer 27' is then patterned by conventional lithography and etching to form the silicon oxide isolation structure 23' between the first and second gate conductors 22 and 24 and the optional silicon oxide spacers 26' along sidewalls of the first and second gate conductors 22 and 24.

Next, additional silicon nitride spacers 26 can preferably be, but is not necessarily, formed along sidewalls of the silicon oxide spacers 26' by first depositing a blanket silicon nitride layer (not shown) followed by conventional lithographic and etching steps as described hereinabove. Note that if no silicon oxide spacers 26' are formed, then the silicon nitride spacers 26 are formed directly over sidewalls of the first and second gate conductors 22 and 24.

Figure 13:
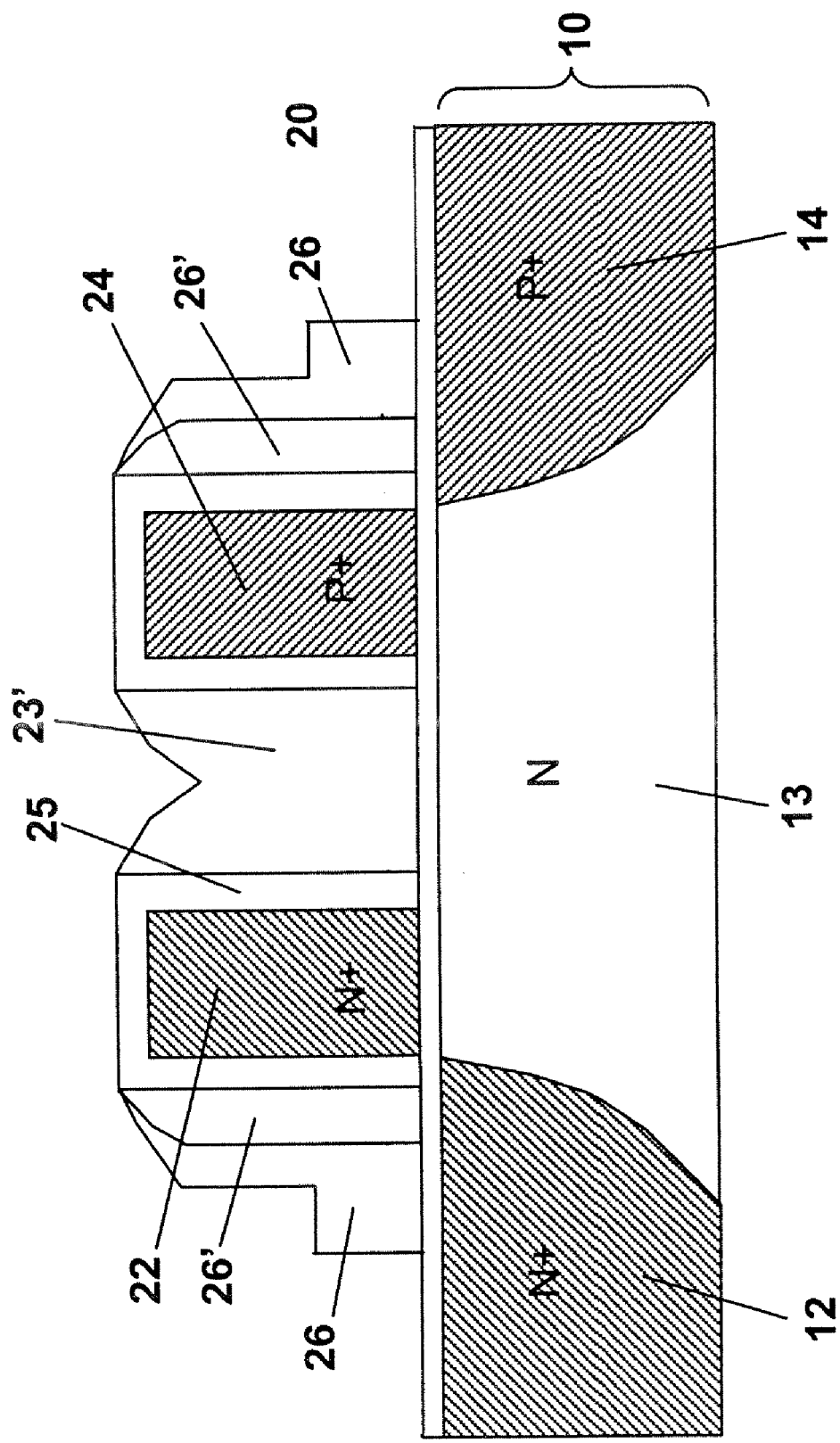
Figure 14:
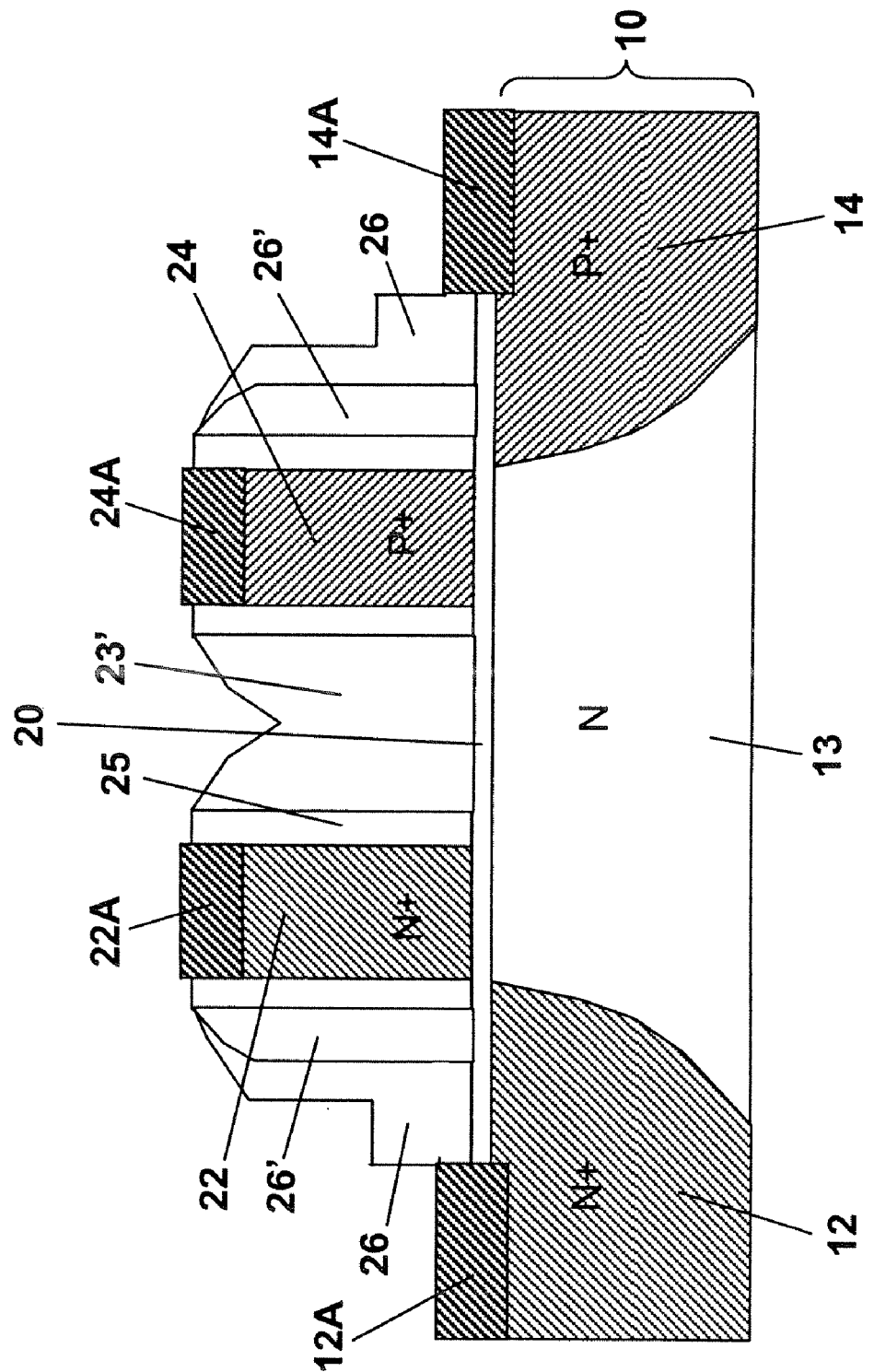

First and second masked dopant implantation steps and the silicidation step, as described hereinabove, can then be carried out to implant n-type and p-type dopant species into the first and second gate conductors 22 and 24 and to form the n-doped and p-doped regions 12 and 14 as well as the surface silicide layers 12A, 14A, 22A, and 24A, as shown in FIGS. 13 and 14.

Figure 15:
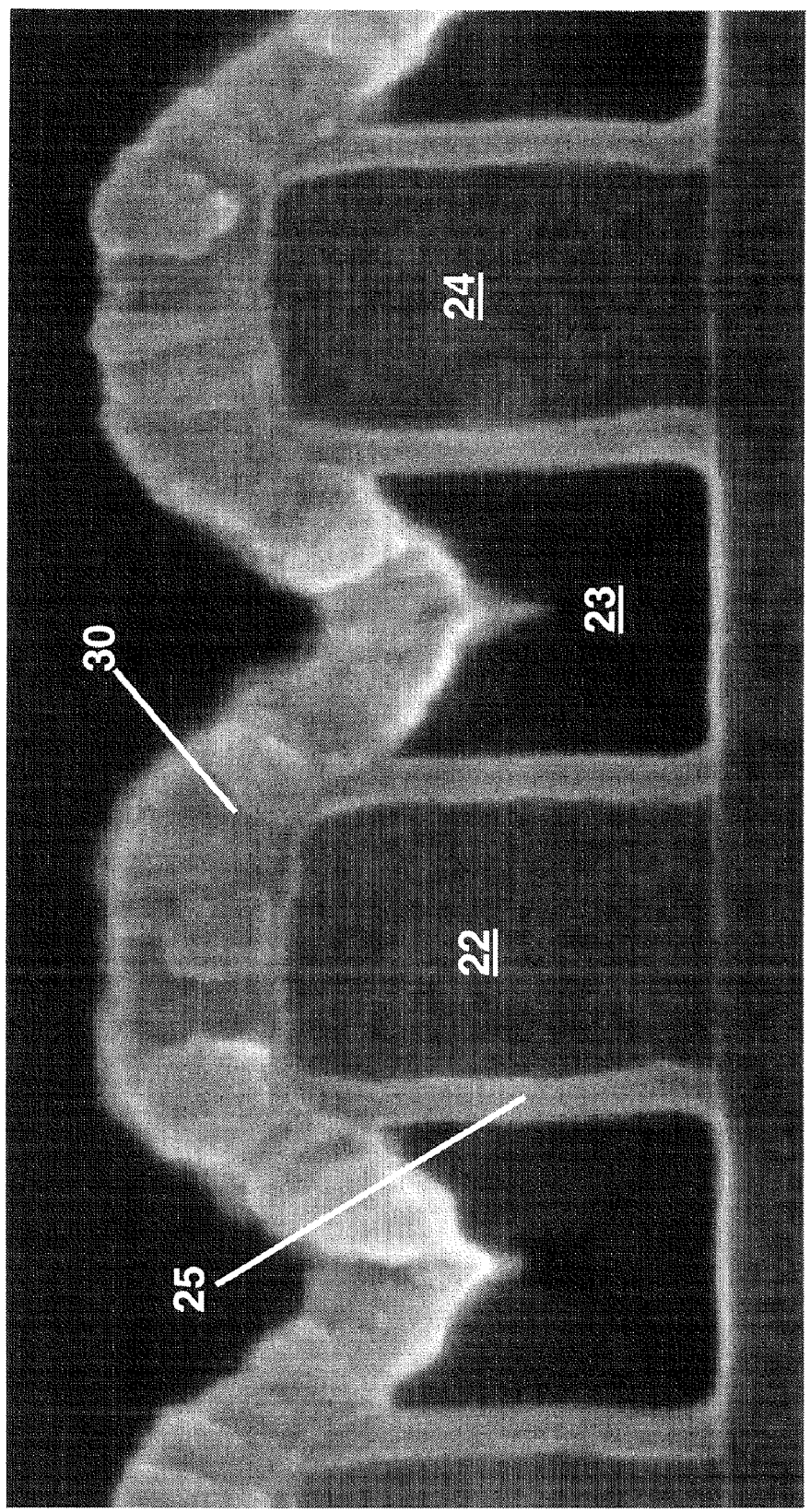
FIG. 15 is a scanning electron microscopic (SEM) photograph of a portion of a CMOS diode of the present invention, which shows the dual gate conductors of the CMOS diode.

FIG. 15 is a SEM photograph of a portion of a CMOS diode that is fabricated according to the description hereinabove. Specifically, FIG. 15 shows a first gate conductor 22 and a second gate conductor 24 that are spaced apart from each other with a silicon nitride isolation structure 23 therebetween. Further, an oxide liner 25 is provided over the first and second gate conductors 22 and 24, and a silicon nitride cap layer 30 is formed over the entire CMOS diode.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising:
a semiconductor substrate having a first doped region of n-type conductivity and a second doped region of p-type conductivity with a third doped region located therebetween, wherein said third doped region has either n-type or p-type conductivity with a dopant concentration lower than that of the first or second region;
a gate dielectric layer located over the semiconductor substrate;
a first gate conductor of n-type conductivity, which is located on a first portion of the gate dielectric layer adjacent to the first doped region in the semiconductor substrate; and
a second gate conductor of p-type conductivity, which is located on a second portion of the gate dielectric layer adjacent to the second doped region in the semiconductor substrate and which is spaced apart and isolated from the first gate conductor by a dielectric isolation structure therebetween, said dielectric isolation structure having a bottommost surface that is in direct contact with an uppermost surface of a third portion of said gate dielectric layer and an uppermost surface that has a non-planar thickness spanning the entirety of the third portion of said gate dielectric layer, wherein the first, second, and third doped regions and the first and second gate conductors are arranged and constructed to form an accumulation region and an underlying depletion region between the third doped region and the second or the first doped region and wherein said first and second gate conductors are located over a contiguous area in which a portion of said third region is in direct contact with said gate dielectric layer.

2. The semiconductor device of claim 1, wherein the dielectric isolation structure comprises a dielectric material selected from the group consisting of oxides, nitrides, and oxynitrides.

3. The semiconductor device of claim 1, wherein the dielectric isolation structure comprises silicon nitride.

4. The semiconductor device of claim 1, wherein the dielectric isolation structure comprises silicon oxide.

5. The semiconductor device of claim 1, wherein the first and second doped regions and the first and second gate conductors each comprises a surface silicide layer.

6. The semiconductor device of claim 1, further comprising one or more dielectric spacers along one or more sidewalls of the first and second gate conductors.

7. The semiconductor device of claim 6, wherein the one or more dielectric spacers comprises one or more oxide spacers.

8. The semiconductor device of claim 7, wherein the one or more dielectric spacers further comprises one or more nitride spacers.

9. The semiconductor device of claim 1, further comprising a dielectric cap layer over the first and second gate conductors and the semiconductor substrate.

10. A semiconductor device comprising:
a semiconductor substrate comprising a first doped region of n-type conductivity and a second doped region of p-type conductivity with a third doped region located therebetween, wherein said third doped region has n-type conductivity with a dopant concentration lower than that of the first region;

a gate dielectric layer located over the semiconductor substrate;

a first gate conductor of n-type conductivity, which is located on a first portion of the gate dielectric layer adjacent to the first doped region in the semiconductor substrate; and a second gate conductor of p-type conductivity, which is located on a second portion of the gate dielectric layer adjacent to the second doped region in the semiconductor substrate and which is spaced apart and isolated from the first gate conductor by a dielectric isolation structure therebetween, said dielectric isolation structure having a bottommost surface that is in direct contact with an uppermost surface of a third portion of said gate dielectric layer and an uppermost surface that has a non-planar thickness spanning the entirety of the third portion of said gate dielectric layer, wherein the first, second, and third doped regions and the first and second gate conductors are arranged and constructed to form an accumulation region and an underlying depletion region between the third doped region and the second doped region and wherein said first and second gate conductors are located over a contiguous area in which a portion of said third region is in direct contact with said gate dielectric layer.

11. The semiconductor device of claim 10, wherein the dielectric isolation structure comprises a dielectric material selected from the group consisting of oxides, nitrides, and oxynitrides.

12. The semiconductor device of claim 10, wherein the dielectric isolation structure comprises silicon nitride.

13. The semiconductor device of claim 10, wherein the dielectric isolation structure comprises silicon oxide.

14. The semiconductor device of claim 10, wherein the first and second doped regions and the first and second gate conductors each comprises a surface silicide layer.

15. The semiconductor device of claim 10, further comprising one or more dielectric spacers along one or more sidewalls of the first and second gate conductors.

16. The semiconductor device of claim 10, further comprising a dielectric cap layer over the first and second gate conductors and the semiconductor substrate.

* * * * *